(12) United States Patent
Woodall et al.

(10) Patent No.: US 8,988,037 B1
(45) Date of Patent: Mar. 24, 2015

(54) SOLAR PANEL STORAGE AND DEPLOYMENT SYSTEM

(75) Inventors: Robert C. Woodall, Panama City, FL (US); Steven F. Naud, Lynn Haven, FL (US); David H Wilbanks, Panama City Beach, FL (US); Amy N. Satterlee, Lynn Haven, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 449 days.

(21) Appl. No.: 13/441,593

(22) Filed: Apr. 6, 2012

(51) Int. Cl.
*H02J 7/00* (2006.01)

(52) U.S. Cl.
USPC .......................................... 320/101; 136/245

(58) Field of Classification Search
USPC .......................................... 320/101; 136/245
See application file for complete search history.

(56) References Cited

U.S. PATENT DOCUMENTS

| | | | | |
|---|---|---|---|---|
| 5,969,501 A * | 10/1999 | Glidden et al. | ............... | 320/101 |
| 6,201,181 B1 * | 3/2001 | Azzam et al. | ................. | 136/244 |
| 7,230,819 B2 * | 6/2007 | Muchow et al. | ............... | 361/601 |
| 7,795,837 B1 * | 9/2010 | Haun et al. | .................... | 320/101 |
| 2008/0068782 A1 * | 3/2008 | Muchow et al. | ............... | 361/601 |
| 2009/0102415 A1 * | 4/2009 | Muchow et al. | ............... | 320/101 |
| 2010/0026235 A1 * | 2/2010 | Harris | ........................... | 320/101 |
| 2011/0277809 A1 * | 11/2011 | Dalland et al. | ................. | 136/244 |
| 2012/0291847 A1 * | 11/2012 | Rowe et al. | .................... | 136/245 |

* cited by examiner

*Primary Examiner* — Edward Tso
*Assistant Examiner* — Ramy Ramadan
(74) *Attorney, Agent, or Firm* — James T. Shepherd

(57) ABSTRACT

A solar panel storage and deployment system includes a container with an opening formed therein and an assembly of solar voltaic panels transitionable between a folded state and a deployed state.

The assembly defines a series of accordion-like folds along the length thereof when in its folded state. The assembly arrays the panels in a substantially planar arrangement when the assembly is in its deployed state. The system also includes at least one stake adapted to be anchored to a position in proximity to and outside of the container. At least one link is provided for coupling an end of the assembly to the stake(s) when the assembly is in its deployed state.

11 Claims, 4 Drawing Sheets

SOLAR PANEL STORAGE AND DEPLOYMENT SYSTEM

STATEMENT OF GOVERNMENT INTEREST

The invention described herein may be manufactured and used by or for the Government of the United States of America for Governmental purposes without payment of any royalties thereon or therefore.

FIELD OF THE INVENTION

The invention relates generally to solar panel assemblies, and more particularly to a system that provides for the storage and deployment of solar panels.

BACKGROUND OF THE INVENTION

Many military and civilian operations in remote areas require the generation of on-site electrical power. The cost of deploying fuel for generators and camp lighting can be quite expensive in terms of both fuel cost and the difficulty of delivering such fuel along potentially dangerous routes. In an effort to reduce the number of fuel delivery convoys, alternative energy sources are being explored. Many regions, such as the desert areas of the Middle East, are especially conducive to the use of solar power systems. Unfortunately, existing systems suffer from one or more shortcomings related to functionality and/or efficiency/optimization. Some are cumbersome to set up. Most do not consider array protection during storage and shipment. Still others do not provide for deployment angle adjustability relative to the sun's seasonal orientation to garner maximum power yield.

SUMMARY OF THE INVENTION

Accordingly, it is an object of the present invention to provide a storage and deployment system for solar panels.

Another object of the present invention is to provide a solar panel storage/deployment system readily adapted to become a self-contained power generator.

Still another object of the present invention is to provide a solar panel storage and deployment system easily optimized for seasonal orientations of the sun.

In accordance with the present invention, a solar panel storage and deployment system includes a container having an opening formed therein. Also included is an assembly of solar voltaic panels transitionable between a folded state and a deployed state. The assembly defines a series of accordion-like folds along the length thereof when in its folded state. The assembly arrays the panels in a substantially planar arrangement when the assembly is in its deployed state. The assembly has a first end and a second end with the first and second ends remaining in the container when the assembly is in its folded state, and the second end positioned outside of the container when the assembly is in its deployed state. The system also includes at least one stake adapted to be anchored to a position in proximity to and outside of the container. At least one link is provided for coupling the second end of the assembly to the stake(s) when the assembly is in its deployed state.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
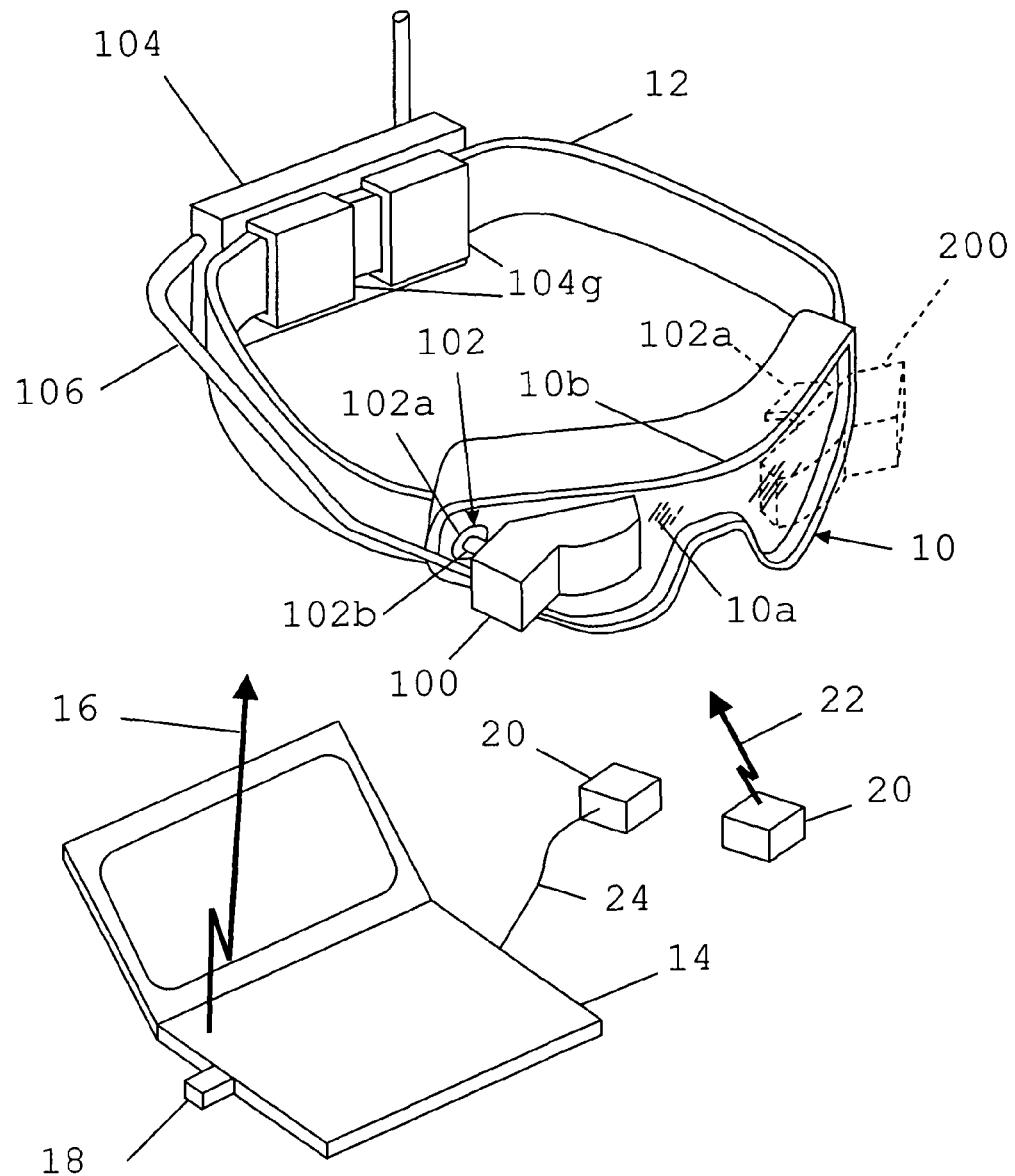
FIG. 1 is a side schematic view of a solar panel storage and deployment system with solar panels in a folded state in accordance with an embodiment of the present invention.

Referring now to the drawings, simultaneous reference will be made to FIGS. 1 and 2 where a system for the storage and deployment of a number of solar panels is shown and is referenced generally by numeral 100. System 100 is illustrated in its folded state (i.e., not deployed from container 10) in FIG. 1 and in its deployed state in FIG. 2. System 100 is positioned at an installation site 200 (e.g., a natural ground location, a man-made platform or pad, etc.) having a clear view of the sun 300. While system 100 could be permanently installed at location 200, a great advantage of the present invention is its ability to provide for the secure/safe storage and shipping of solar panels to installation site 200 followed by the simple deployment of the solar panels into an efficient collector of solar energy. The system also provides for simple/efficient pack-up, transport, and re-deployment if needed. Accordingly the description of system 100 will focus on the features providing these capabilities.

System 100 includes a container 10 that houses the elements of system 100 during the storage, shipping, and deployment thereof. Some of these elements in conjunction with container 10 also provide support for one side of a solar panel assembly as will be described later herein. Container 10 can be a standardized container (e.g., an ISO container) or a specially designed container without departing from the scope of the present invention. Container 10 will typically be of rigid construction.

As used herein, the term "solar panel" refers to a flexible or rigid solar voltaic panel that, when exposed to solar energy, generates DC power. One commercial source for flexible solar voltaic panels is Xunlight Corporation, Toledo, Ohio. One commercial source for a rigid solar panel (e.g., poly crystalline cells mounted in a rigid metal frame) is Suntech, San Francisco, Calif. Thus, the term "solar panel assembly" as used herein includes pre-made solar panels as well as a plurality of solar cells arranged into solar voltaic panels where the panels can be flexible or rigid without departing from the scope of the present invention. By way of illustrative example, the embodiment in FIGS. 1 and 2 illustrates a number of spaced-apart solar panels 12 mounted/coupled to a flexible substrate 14 where width-spanning regions 140 of substrate 14 can be folded. Such folding occurs in an alternating or accordion-like fashion. To facilitate such accordion-like folding, each of regions 140 can incorporate a hinge 16 such that the solar panel assembly is thereby defined by panels 12, substrate 14, and hinges 16. Each hinge 16 is capable of movement that will support the solar panel assembly in its folded state (FIG. 1) and in its deployed state (FIG. 2). That is, in the assembly's folded state (FIG. 1), arms 160 and 162 of each hinge 16 oppose one another to form an angle of approximately 0°. However, in the assembly's deployed state (FIG. 2), arms 160 and 162 of each hinge 16 align with one another to form an angle of approximately 180°. For the above-described accordion folding, hinges 16 alternate in terms of their opening orientation as would be understood in the art. If hinges 16 incorporate a spring bias to the 180° position (FIG. 2), hinges 16 can facilitate the transition from the assembly's folded state to its deployed state. Conversely, if hinges 16 incorporate a spring bias to the 0° position (FIG. 1), hinges 16 facilitate the transition from the assembly's deployed state to its folded state. Spring biasing of hinges 16 can be achieved in a variety of ways without departing from the scope of the present invention.

The number of solar panels 12 used in the above-described solar panel assembly is not a limitation of the present invention. Flexible substrate 14 can be any material that can support panels 12 and withstand the rigors of an operational environment. For example, flexible substrate 14 could be a tensile fabric such as fabrics made from commercially-available fibers such as KEVLAR or SPECTRA fibers. Hinges 16 can be simple one-piece plastic hinges or multiple-piece hinges without departing from the scope of the present invention. The coupling of hinges 16 to substrate 14 can be achieved in a variety of ways that are not limitations of the present invention. Substrate 14 can extend the full length of the solar panel assembly (as shown) or between adjacent ones of hinges 16 without departing from the scope of the present invention.

Deployment and retraction of the assembly from and into container 10 is made via opening 10A formed in container 10 where opening 10A can be sealable. While the solar panel assembly is in its folded state, solar panels 12 are in a substantially vertical orientation within container 10 and the assembly can be supported on a bearing support 20 mounted/housed in container 10. In general, bearing support 20 (e.g., slide rails, slide table, etc.) provides a sliding support platform on which the lowermost ones of hinges 16 slide as the solar panel assembly transitions to its deployed state and transitions back to its folded state. More specifically, one end of the assembly (e.g., an end 14A of substrate 14) remains attached to bearing support 20 as the other end of the assembly (e.g., an opposing end 14B of substrate 14) is drawn out through opening 10A of container 10.

Figure 2:
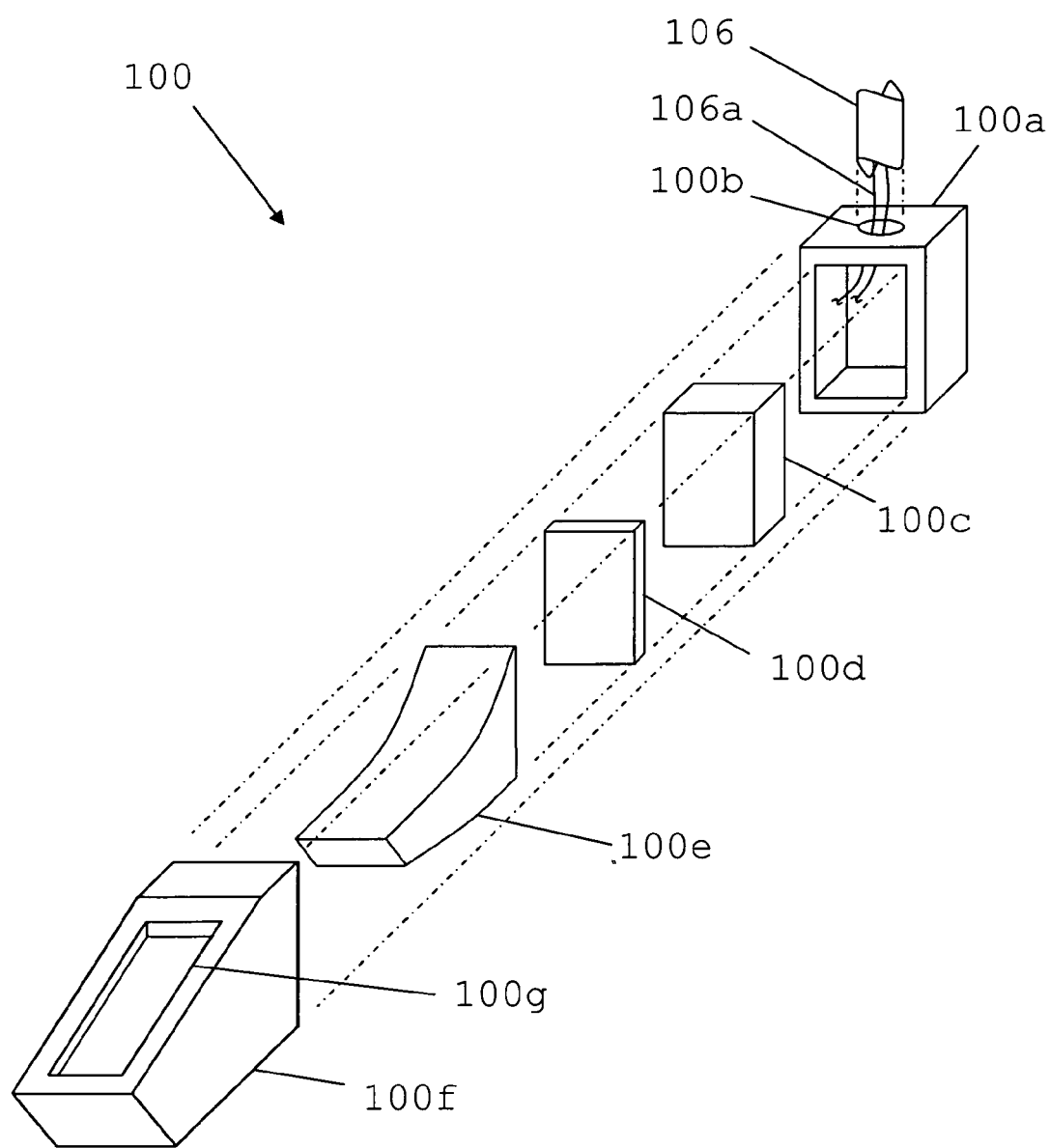
FIG. 2 is a perspective view of a solar panel storage and deployment system with solar panels in a deployed state in accordance with an embodiment of the present invention.

When the solar panel assembly is deployed as shown in FIG. 2, end 14B is coupled to a stake 22 by a link 24. Stake 22 is any rigid support that can be fixed at a point outside of container 10 at installation site 200. Link 24 can be integrated with substrate 14 or stake 22, or can be attachable thereto without departing from the scope of the present invention. In general, stake 22 and link 24 cooperate to place substrate 14 and hinges 16 in tension (i.e., hinges in the 180° position) to thereby define a planar support for panels 12. Further, stake 22 and link 24 cooperate to set the angle (relative to sun 300) of the planar support provided by substrate 14 and hinges 16 to thereby set the angle of panels 12 with respect to sun 300. In this way, the present invention can optimize the angular orientation of panels 12 relative to the seasonal orientation of sun 300. Link 24 can be adjustable in length (e.g., a ratchet strap) and/or made from an elastic material (e.g., elastic band, bungee cord, etc.) to provide the requisite amount of tension in flexible substrate 14/hinges 16 to help maintain a substantially planar orientation of substrate 14/hinges 16 in the deployed state of the solar panel assembly.

Retraction and re-packing of the solar panel assembly from its deployed state (FIG. 2) to its folded state (FIG. 1) is simply a reversal of the deployment process. That is, in general, link(s) 24 are detached from stake(s) 22 (and, possibly, the solar panel assembly). The solar panel assembly is then accordion folded where such accordion folding can be aided by hinges 16 if they incorporate a spring bias to the 0° position as explained above. While this can be accomplished manually, retraction and re-packing could also be facilitated by a spool cooperating with a retraction member(s) as illustrated by the embodiment in FIGS. 1 and 2. More specifically, a spool 30 is housed/mounted in container 10 for rotation in two directions about its central axis (as indicated by two-headed arrow 32). Rotation 32 can be induced by manual rotation of spool 30. Spool 30 can be torsionally biased to facilitate retraction of the solar panel assembly when it is being re-packed. Still another option is to provide a motor 34 in container 10 that is operationally coupled to spool 30 to induce rotation 32. During retraction/re-packing, rotation 32 is used to refold the solar panel assembly at hinges 16. In the illustrated embodiment, one (or more) flexible retraction cords 36 are coupled one end thereof to spool 30 and on the other end thereof to end 14B of substrate 14. To keep the solar panel assembly aligned during the refolding operation, cords 36 can also be passed through rings 38 attached to hinges 16 near the outside edges thereof and at, for example, the top of the folded assembly as shown. In this way, as cords 36 are wound on spool 30, end 14B is pulled back towards container 10 as the solar panel assembly refolds along the lines defined by cords 36 until it is ultimately stored in container 10 on bearing table 20. Rings 38 could be replaced by holes in hinges 16 without departing from the scope of the present invention.

Figure 3:
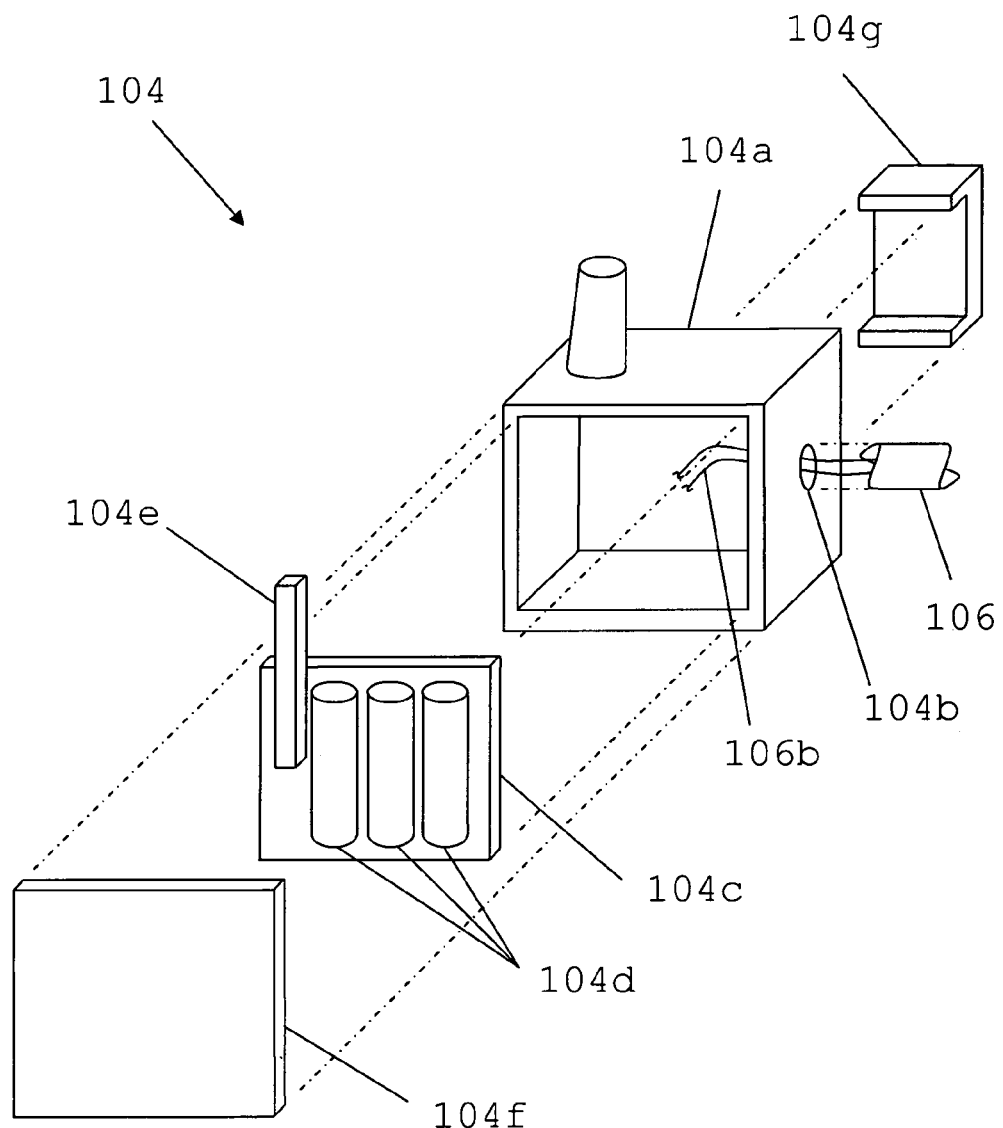
FIG. 3 is a schematic view of an electrical system that can be used to convert DC power from the solar panels to AC power in accordance with an embodiment of the present invention.

In addition to the mechanical storage and deployment features provided by the present invention, an electrical system can be provided to cooperate with solar panels 12 so that the present invention is a self-contained power provider. FIG. 3 presents a schematic view of an embodiment of a simple electrical system coupled to panels 12. Since panels 12 typically generate DC power, an AC/DC converter 40 converts the panels' DC power to AC power. One or more AC power outlets 42 can be coupled to converter 40. One or more batteries 44 could also be provided between panels 12 and converter 40 to store the panels' generated DC power until it is needed by appliances or other systems (not shown) coupled to AC power outlets 42. The electrical system can include different and/or additional elements as would be understood by one of ordinary skill in the art. The electrical system can be housed within container 10.

Figure 4:
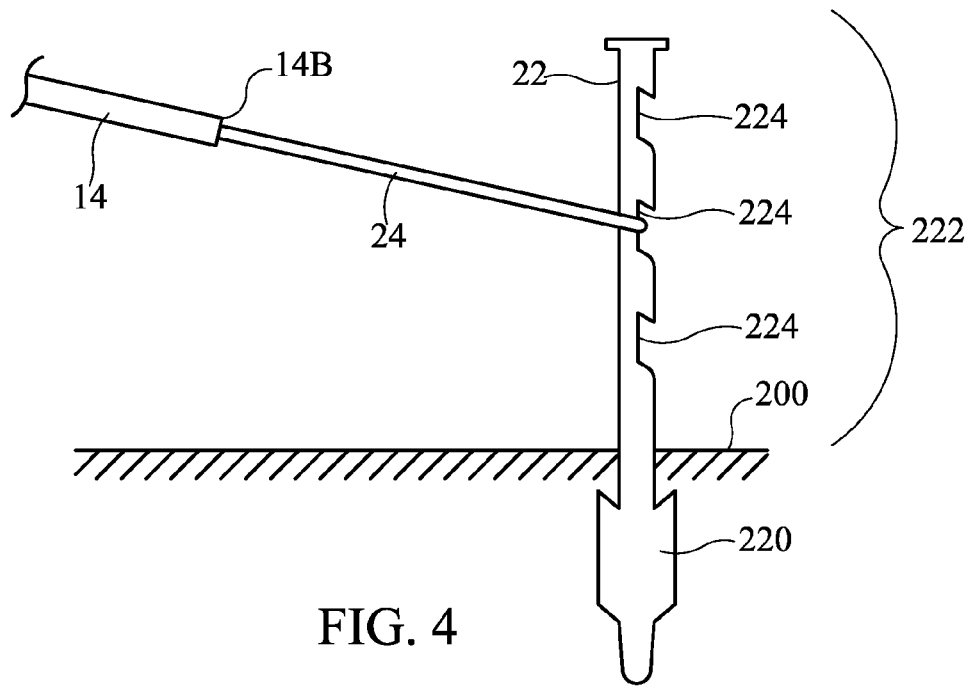
FIG. 4 is an isolated side view of the free end of the solar panel assembly coupled to a stake by a tension member in accordance with an embodiment of the present invention.

As mentioned above, stake 22 and link 24 cooperate to tension and angularly orient the solar panel assembly of panels 12/substrate 14/hinges 16. An example of a stake 22 and link 24 is illustrated in FIG. 4. Stake 22 includes an anchoring end 220 designed to be readily driven into the ground at location site 200. The particular design of end 220 is not a limitation of the present invention. The exposed portion 222 of stake 22 defines a number of attachment points 224 along its length/height. For example, attachment points 224 could be notches formed in stake 22. Link 24 could be a tension member (e.g., elastic band, bungee cord, ratchet strap, etc.) coupled to end 14B of substrate 14 and to one of attachment points 224. The choice of attachment point 224 will determine the angular orientation of substrate 14 and, therefore, the angular orientation of panels 12 coupled thereto.

Figure 5:
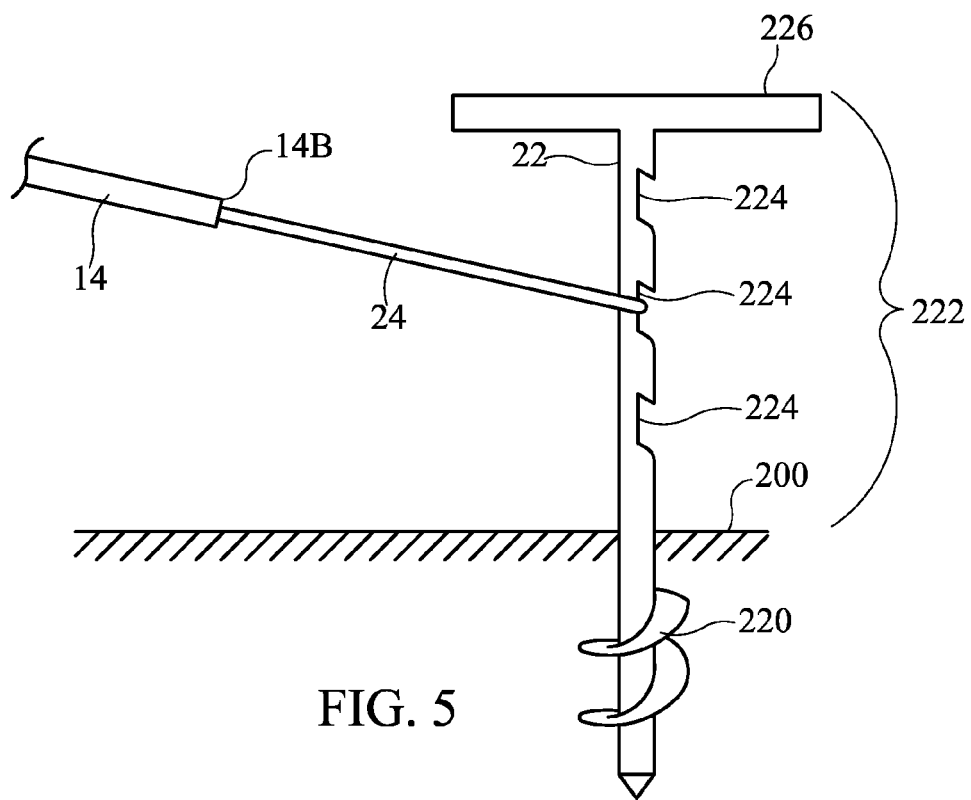
FIG. 5 is an isolated side view of a stake in accordance with another embodiment of the present invention.
Figure 1:
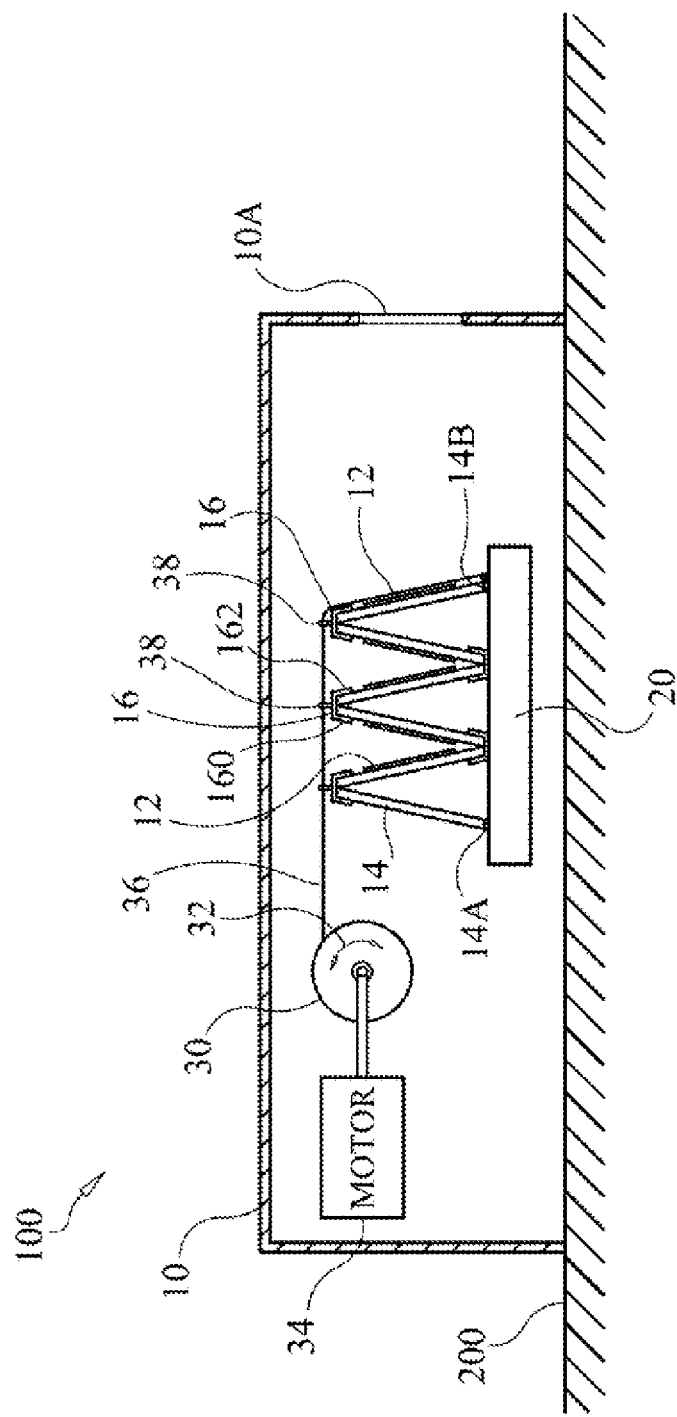
Figure 2:
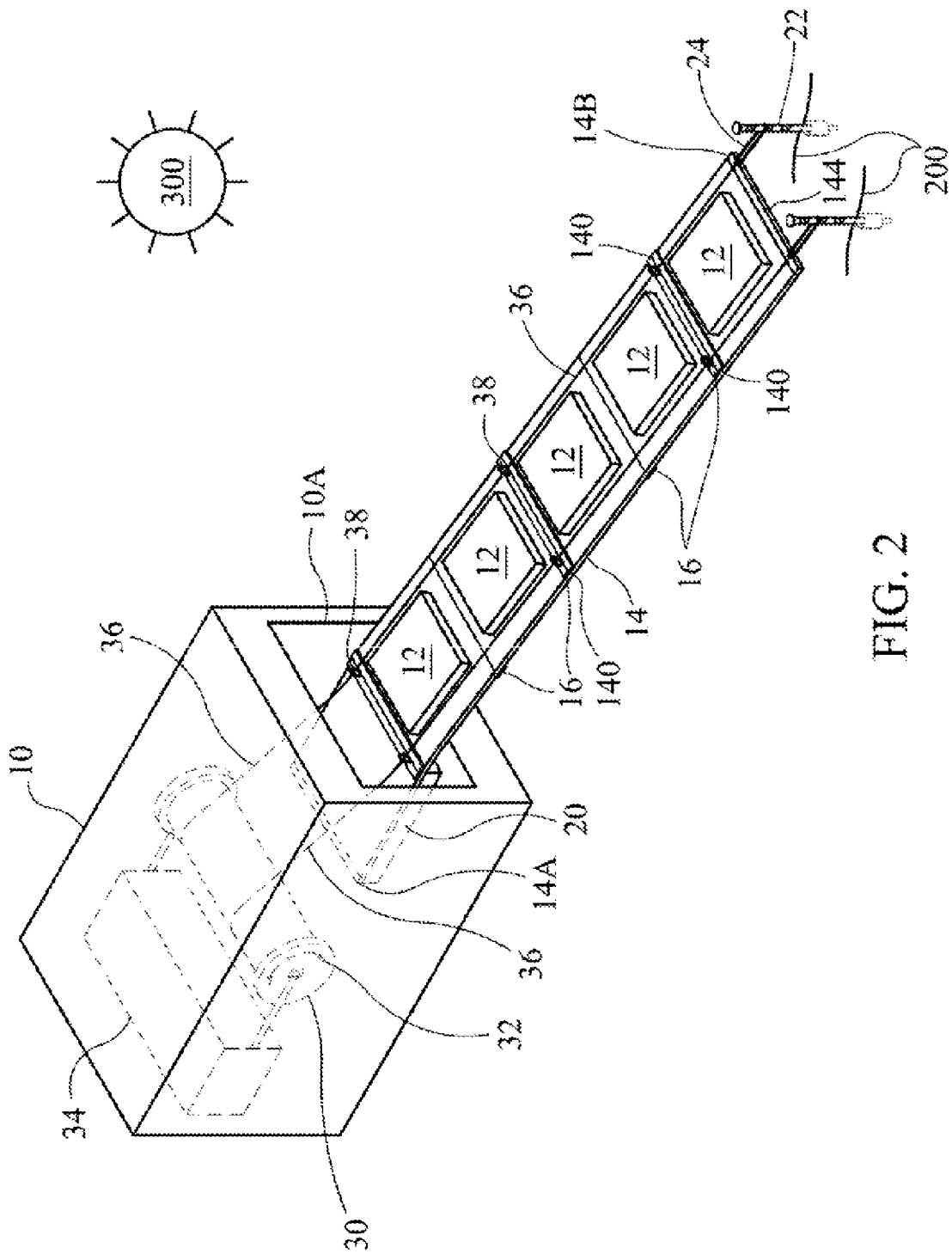
Figure 3:
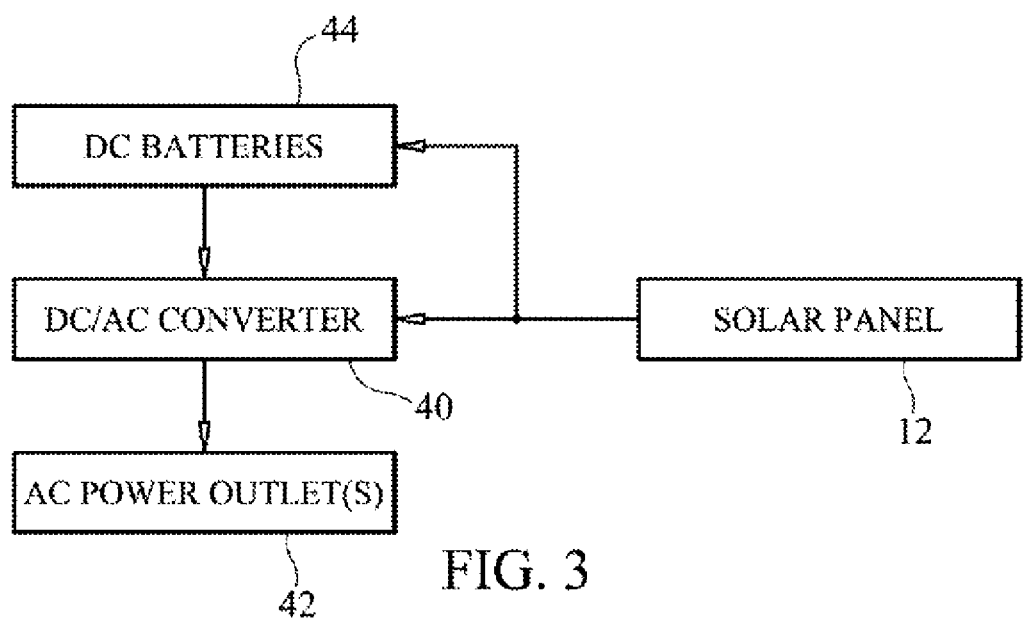

FIG. 5 illustrates another type of stake 22 having a screw-shaped anchoring end 220 and a T-handle 226 formed at the top of stake 22. This type of stake can be screwed into the ground at location site 200 without the use of any tools.

The advantages of the present invention are numerous. Solar arrays are safely and securely stored for shipping, but readily deployed once on site. A simple angular orientation system allows the orientation of the panels to be easily adjusted for optimum capture of solar energy. By using a foldable solar panel assembly, the storage size of the assembly is optimized for storage. An onboard electrical system can be added to make the entire system a self-contained AC power source.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A solar panel storage and deployment system, comprising:
    a container having an opening formed therein;
    a rotatable spool housed in said container;
    an assembly of solar voltaic panels transitionable between a folded state and a deployed state, wherein said assembly defines a series of accordion-like folds along the length of said assembly when in said folded state, and wherein said assembly arrays said panels in a substantially planar arrangement when in said deployed state, said assembly having a first end and a second end;
    a support mounted in said container for supporting said assembly in said folded state within said container and during transition to said deployed state with said first end of said assembly being coupled to said support as said second end of said assembly is drawn through said opening in said container;
    at least one stake adapted to be anchored to a position in proximity to and outside of said container;
    at least one link for coupling said second end of said assembly to said at least one stake when said assembly is in said deployed state; and at least one flexible member coupled to said spool and to said second end of said assembly wherein, when said assembly is in said deployed state and said spool is rotated to wind said at least one flexible member thereon, said assembly transitions from said deployed state to said folded state.

2. A system as in claim 1, wherein said panels generate DC power when so-deployed and exposed to solar energy, said system further comprising an electrical system electrically coupled to said panels for converting said DC power generated by said panels to AC power.

3. A system as in claim 2, further comprising at least one DC power storage element electrically coupled to said electrical system for storing said DC power.

4. A system as in claim 1, further comprising a motor operatively coupled to said spool for rotating said spool.

5. A system as in claim 1, wherein said assembly includes a flexible substrate for supporting said panels thereon.

6. A system as in claim 5, wherein said flexible substrate comprises a tensile fabric.

7. A system as in claim 1, wherein each of said folds is defined by a flexible hinge providing approximately 180° of rotation.

8. A system as in claim 7, wherein each said flexible hinge is spring-biased.

9. A system as in claim 1, wherein each said stake defines a plurality of attachment points for cooperation with one said link, each of said attachment points being at a unique location on said stake.

10. A system as in claim 1, wherein each said link is adjustable in length.

11. A system as in claim 1, wherein each of said panels is in a substantially vertical orientation when in said folded state.

* * * * *

UNITED STATES PATENT AND TRADEMARK OFFICE
CERTIFICATE OF CORRECTION

Page 1 of 4

PATENT NO.         : 8,988,037 B1
APPLICATION NO.    : 13/441593
DATED              : March 24, 2015
INVENTOR(S)        : Robert C. Woodall et al.

It is certified that error appears in the above-identified patent and that said Letters Patent is hereby corrected as shown below:

In the drawings

Replace Figures 1, 2, and 3 with attached drawings:

Signed and Sealed this
Twenty-fourth Day of November, 2015

Michelle K. Lee
*Director of the United States Patent and Trademark Office*